United States Patent
Liu et al.

(12)

(10) Patent No.: US 10,352,966 B2
(45) Date of Patent: Jul. 16, 2019

(54) METHOD, SYSTEM FOR UTILIZING A PROBE CARD, AND THE PROBE CARD

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Chang-Ming Liu, Hsinchu County (TW); Chien-Hao Lin, Miaoli County (TW); Shih-Hua Hsu, Hsinchu (TW); Ning-Chun Hsu, Miaoli County (TW)

(73) Assignees: GLOBAL UNICHIP CORPORATION, Hsinchu (TW); TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 443 days.

(21) Appl. No.: 15/253,900

(22) Filed: Sep. 1, 2016

(65) Prior Publication Data

US 2017/0276701 A1    Sep. 28, 2017

(30) Foreign Application Priority Data

Mar. 23, 2016  (CN) .......................... 2016 1 0167556

(51) Int. Cl.
*G01R 1/073* (2006.01)
*G01R 31/28* (2006.01)

(52) U.S. Cl.
CPC ..... *G01R 1/07364* (2013.01); *G01R 31/2889* (2013.01)

(58) Field of Classification Search
CPC ................ G01R 31/28; G01R 31/2801; G01R 31/2806; G01R 31/2851–2898; G01R 1/073–07392

See application file for complete search history.

(56) References Cited

U.S. PATENT DOCUMENTS

| 6,762,612 | B2* | 7/2004 | Yu ....................... | G01R 1/07314 |
| | | | | 324/750.17 |
| 7,068,056 | B1* | 6/2006 | Gibbs ................ | G01R 31/2891 |
| | | | | 324/750.16 |
| 7,764,076 | B2* | 7/2010 | Di Stefano ............. | G01M 1/12 |
| | | | | 324/756.01 |
| 8,350,584 | B2* | 1/2013 | Nappen .............. | G01R 31/2887 |
| | | | | 324/754.15 |
| 8,779,792 | B2* | 7/2014 | Kim ................... | G01R 31/2891 |
| | | | | 324/756.03 |
| 2006/0255814 | A1* | 11/2006 | Eldridge ............ | G01R 31/2863 |
| | | | | 324/750.03 |

(Continued)

*Primary Examiner* — Huy Q Phan
*Assistant Examiner* — David B Frederiksen
(74) *Attorney, Agent, or Firm* — CKC & Partners Co., LLC

(57) ABSTRACT

A method for utilizing a probe card includes steps as follows. Providing a probe card having three alignment marks on a reference plane of a circuit board; moving the circuit board to be oriented to a wafer-loading plane of a wafer stage with the reference plane; determining whether a geometric plane defined by the alignment marks is parallel to the wafer-loading plane; and when the geometric plane is not parallel to the wafer-loading plane, adjusting a levelness of the circuit board until the reference plane is parallel to the wafer-loading plane.

13 Claims, 10 Drawing Sheets

(56) References Cited

U.S. PATENT DOCUMENTS

| | | | |
|---|---|---|---|
| 2006/0290367 A1* | 12/2006 | Hobbs | G01R 31/2886 324/750.22 |
| 2010/0196136 A1* | 8/2010 | Gunji | G01R 3/00 414/806 |
| 2014/0015955 A1* | 1/2014 | Beijert | G01R 31/2801 348/79 |
| 2016/0047857 A1* | 2/2016 | Lee | G01R 31/2891 324/750.22 |

* cited by examiner

METHOD, SYSTEM FOR UTILIZING A PROBE CARD, AND THE PROBE CARD

RELATED APPLICATIONS

This application claims priority to China Application Serial Number 201610167556.9, filed Mar. 23, 2016, which is herein incorporated by reference.

BACKGROUND

Field of Disclosure

The present disclosure relates to a method, system for utilizing a probe card and the probe card.

Description of Related Art

A conventional probe card electrically contacts with conductive leads of a device under test (DUT) with a number of probe pins thereof for testing the DUT. Normally, before the probe card tests the DUT, the probe card has to be installed levelly so as to be parallel to a horizontal reference plane. In a conventional way, the levelness of the probe card is measured based on a virtual plane defined by pinpoints of the probe pins.

However, if the probe pins are not aligned levelly with each other, the virtual plane defined by pinpoints of the probe pins may be indefinite, so that the probe card may be failed to be installed levelly, and cannot be guaranteed that all of the probe pins completely and properly contact with all of the conductive leads of the DUT, thereby causing inaccurateness of testing results.

Therefore, ways to provide a solution to effectively solve the aforementioned inconvenience and shortages and to increase the competitiveness of industries will be seriously concerned.

SUMMARY

An aspect of the disclosure is to provide a method, a system for utilizing a probe card and the probe card to overcome the defects and inconvenience of the prior art.

According to one embodiment, the method for utilizing a probe card includes (a) providing a probe card comprising a plurality of probe pins and a circuit board having a reference plane and at least three first alignment marks which are formed on the reference plane and not collinear with each other, the first alignment marks collectively define a first geometric plane which is the same plane as the reference plane; (b) moving the probe card to be oriented to a wafer-loading plane of a wafer stage (aka prober chuck) with the reference plane of the circuit board; (c) determining whether the first geometric plane is parallel to the wafer-loading plane; (d) adjusting a levelness of the circuit board to arrange the first geometric plane to be parallel to the wafer-loading plane when a determination of the first geometric plane being not parallel to the wafer-loading plane is made; and (e) contacting a wafer which is located on the wafer-loading plane with the probe pins, and testing the wafer when the first geometric plane is parallel to the wafer-loading plane.

Therefore, other than measuring the levelness of the probe card with a virtual plane defined by pinpoints of the probe pins in the conventional way, measuring the levelness of the probe card with a geometric plane collectively defined by the first alignment marks located on the reference plane of the circuit board in one embodiment of the disclosure is easier to guarantee that the probe card is parallel to the wafer-loading plane of the wafer stage so that all of the probe pins may completely and properly contact with all of the conductive leads of the DUT, thereby causing accurateness of testing results through the causing accurateness of testing results through the probe card.

According to another embodiment, the system for utilizing a probe card including a wafer stage, a probe card, a movable carrier and a levelness adjustment device. The wafer stage is provided with a wafer-loading plane for loading a wafer thereon. The probe card includes a plurality of probe pins and a circuit board having a reference plane and at least three first alignment marks which are located on the reference plane and not collinear with each other. The first alignment marks are coplanar with the reference plane, and a virtual plane collectively defined by pinpoints of the probe pins is parallel to the reference plane. The movable carrier moves the probe card to be oriented to the wafer-loading plane with the reference plane of the circuit board. The levelness determination device determines whether a first geometric plane collectively defined by the first alignment marks is parallel to the wafer-loading plane. The levelness adjustment device adjusts a levelness of the circuit board.

According to another embodiment, the probe card includes a support frame, a circuit board, a plurality of probe pins and at least three levelness adjustment screws. The support frame is provided with a frame opening thereon. The circuit board is installed on the support frame, in which the circuit board is provided with a reference plane exposing outwards from the frame opening, and the reference plane is formed with at least three alignment marks which are not collinear with each other, and the alignment marks are coplanar with the reference plane. The probe pins is connected to the reference plane of the circuit board for contacting a wafer. The levelness adjustment screws are screwed on the circuit board, respectively, and one end of each of the levelness adjustment screws pushes against the support frame for adjusting the levelness of the circuit board relative to the support frame.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
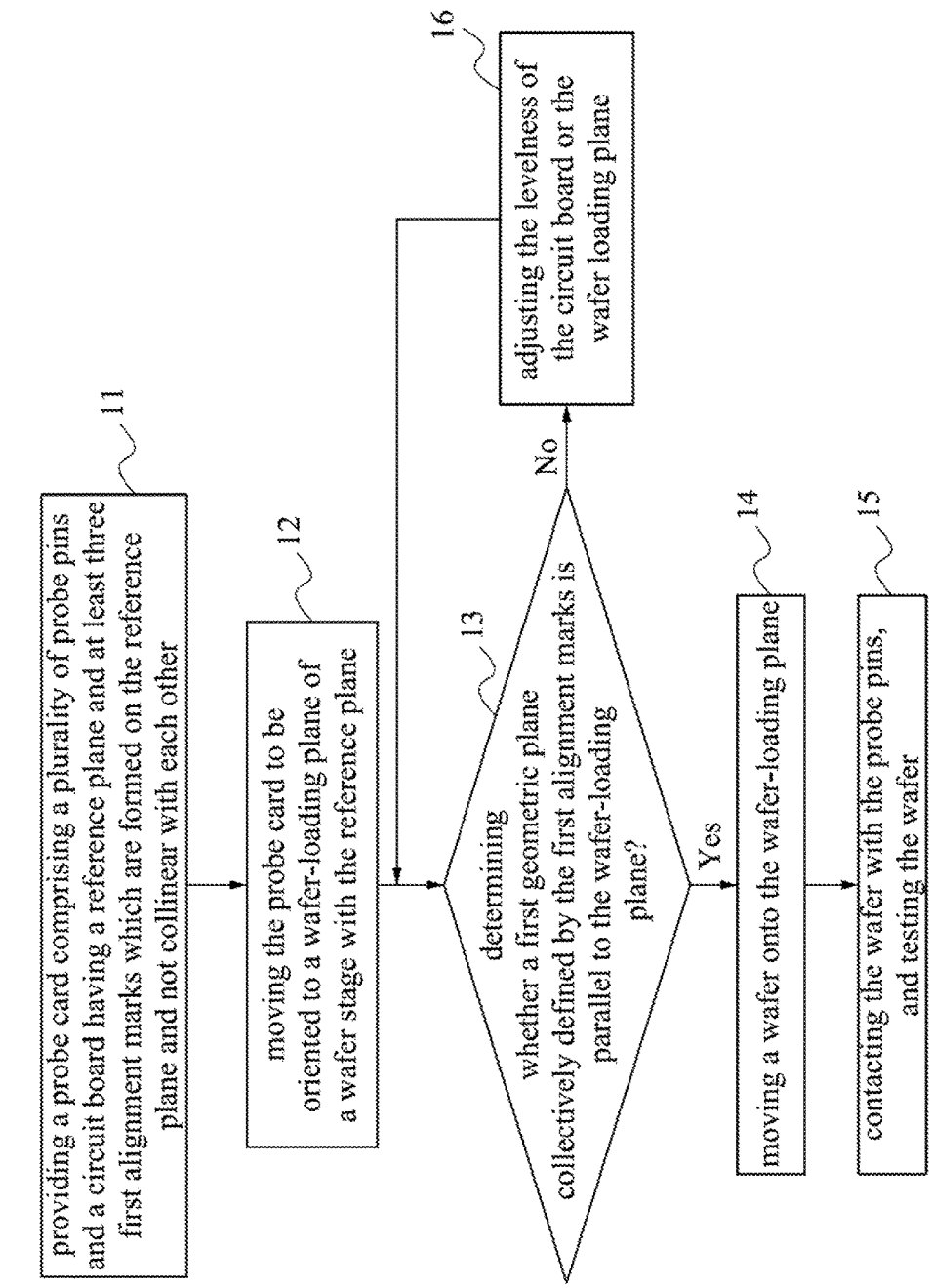
FIG. 1 is a flow chart of a method for utilizing a probe card according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the disclosure.

Reference is now made to FIG. 1 in which FIG. 1 is a flow chart of a method for utilizing a probe card according to one embodiment of the disclosure. As shown in FIG. 1, the method 10 for utilizing a probe card includes step 11 to step 16 outlined as follows. In step 11, a probe card is provided, in which the probe card includes a plurality of probe pins and a circuit board having a reference plane and at least three first alignment marks (as identification references) which are located on the reference plane and not collinear with each other, and the first alignment marks collectively define a first geometric plane which is the same plane as the reference plane. In step 12, the probe card is moved to be oriented to a wafer-loading plane of a wafer stage with the reference plane of the circuit board. In step 13, a determination is made as to whether the first geometric plane collectively defined by the first alignment marks is parallel to the wafer-loading plane, if yes, go to step 14, otherwise, go to step 16. In step 14, a wafer is moved onto the wafer-loading plane of the wafer stage. However, it is noted that step 14 is not necessarily required to be later than step 13 in other embodiments. In step 15, the probe pins are moved to contact the wafer loaded on the wafer-loading plane for follow-up test processes. In step 16, the levelness of the circuit board or the wafer-loading plane is adjusted. In one embodiment, the step 16 can be exemplarily performed by adjusting at least one of levelness adjustment screws screwed on the circuit board. However, it is noted that the method of the disclosure is not limited to any conventional tools or instruments for adjusting the levelness of the reference plane of the circuit board.

Therefore, other than the aforementioned prior art, the embodiment to determine whether the wafer-loading plane is parallel to the geometric plane of the first alignment marks is easier to guarantee the probe card being parallel to the wafer-loading plane, thereby, not only reducing the complexity of the process and the lead time of the process, but also reducing the possibilities of inaccurate testing performance of the probe card.

In details, the probe pins are installed and adjusted in concern with the reference plane having the first alignment marks thereon so as to ensure that a virtual plane collectively defined by pinpoints of the probe pins is parallel to the wafer-loading plane. Thus, in this embodiment, a virtual plane collectively defined by pinpoints of the probe pins can be detected first, and a determination is preliminarily made as to whether the reference plane is parallel to the virtual plane collectively defined by pinpoints of the probe pins.

Figure 2:
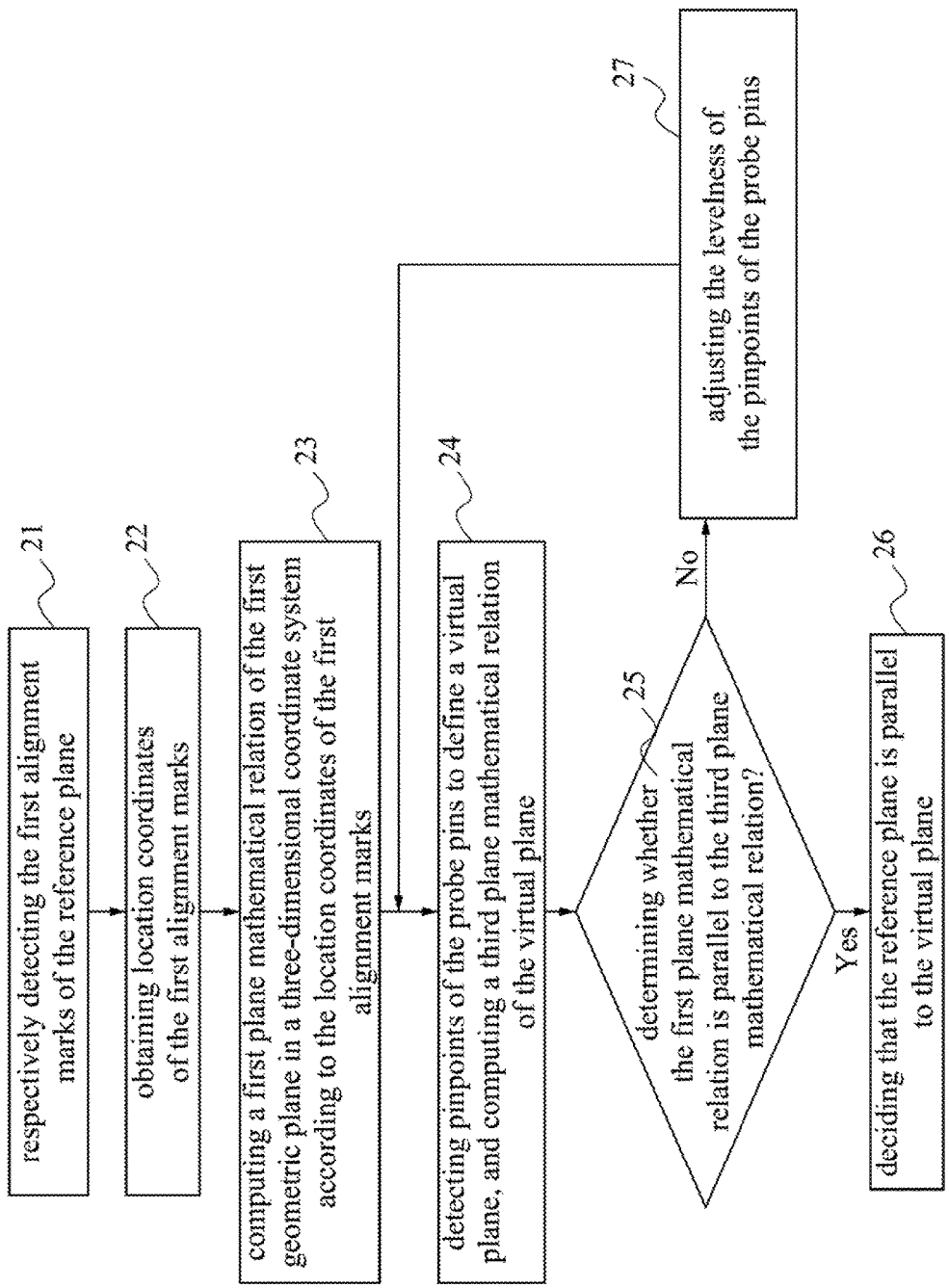
FIG. 2 is a sub-flow chart of step 11 of FIG. 1 according to one detailed embodiment.

Thus, as shown in FIG. 2 in which FIG. 2 is a sub-flow chart of step 11 of FIG. 1 according to one detailed embodiment. The reference plane being adjusted to be parallel to the virtual plane includes step 21 to step 27 as follows. In step 21, the first alignment marks of the reference plane are detected respectively. In step 22, location coordinates of the first alignment marks are respectively obtained according to the detected first alignment marks. In step 23, a first plane mathematical relation of the first geometric plane in a three-dimensional coordinate system (e.g., Cartesian coordinate system) is computed (calculated) according to the location coordinates of the first alignment marks. For example, the first plane mathematical relation can be a plane vector function or a plane equation, or any method capable of indicating the plane location of the reference plane. In step 24, the pinpoints of the probe pins are detected to define the virtual plane, and a third plane mathematical relation in the three-dimensional coordinate system according to the virtual plane is computed (calculated). For example, the third plane mathematical relation can be a plane vector function or a plane equation, or any method capable of indicating the plane location of the reference plane. In addition, it is noted that step 24 is not necessarily required to be later than step 23 in other embodiments. In step 25, a determination is made as to whether the first plane mathematical relation is parallel to the third plane mathematical relation; if yes, go to step 26, that is, the reference plane is determined to be parallel to the virtual plane, otherwise, go to step 27. In step 27, the levelness of pinpoints of the probe pins are adjusted, and then, back to step 24, step 25, and even back to step 27, until the first plane mathematical relation is determined to be parallel to the third plane mathematical relation already. It is noted that the method of the disclosure is not limited to any conventional tools or instruments capable of detecting the virtual plane defined by pinpoints of the probe pins.

Furthermore, the aforementioned step 24 according to another embodiment further includes steps as follows. After the virtual plane defined by pinpoints of the probe pins is detected, a determination is made as to whether the pinpoints of the probe pins are coplanarly aligned with each other for collectively defining the virtual plane. When the pinpoints of the probe pins are not coplanarly aligned with each other for collectively defining the virtual plane, the alignments of the pinpoints of the probe pins are adjusted, and the step of detecting and determining whether the pinpoints of the probe pins are coplanarly aligned with each other for collectively defining the virtual plane, and the step of adjusting the alignment of the pinpoints of the probe pins are repeated in a few time, until the pinpoints of the probe pins can be coplanarly aligned with each other to collectively define the virtual plane. It is noted that the method of the disclosure is not limited to any conventional tools or instruments capable of detecting the virtual plane defined by pinpoints of the probe pins and the method of the disclosure is not limited to any conventional tools or instruments capable of determining whether the pinpoints of the probe pins are coplanarly aligned with each other.

Figure 3:
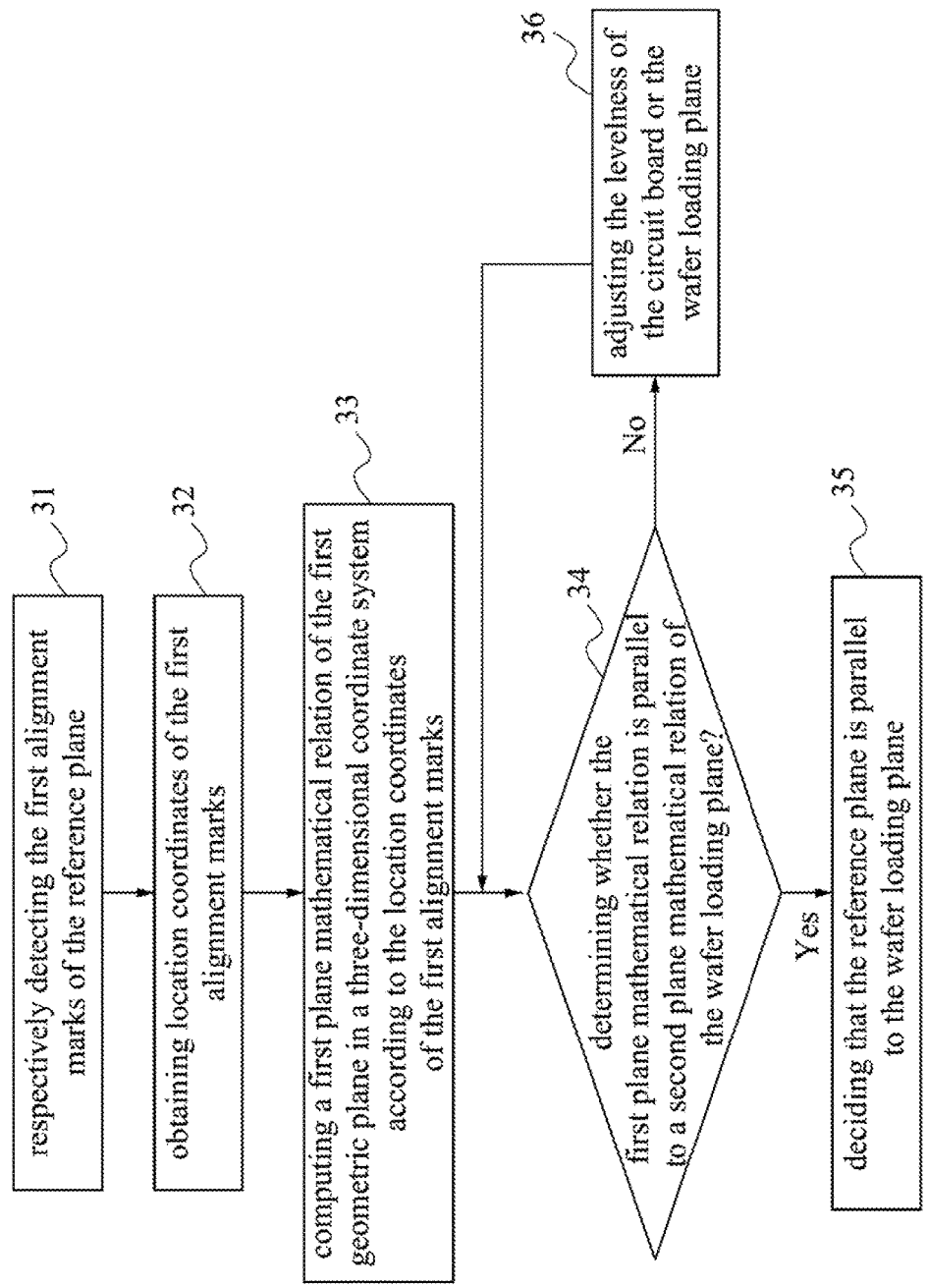
FIG. 3 is a sub-flow chart of step 13 of FIG. 1 according to one detailed embodiment.

FIG. 3 is a sub-flow chart of step 13 of FIG. 1 according to one detailed embodiment. As shown in FIG. 3, step 13 of the embodiment further includes step 31-step 36 outlined as follows. In step 31 the first alignment marks of the reference plane are detected respectively. In step 32, location coordinates of the first alignment marks are respectively obtained according to the detected first alignment marks. In step 33, a first plane mathematical relation of the first geometric plane in a three-dimensional coordinate system (e.g., Cartesian coordinate system) is computed (calculated) according to the location coordinates of the first alignment marks. For example, the first plane mathematical relation can be a plane vector function or a plane equation, or any method capable of indicating the plane location of the reference plane.

In step 34, a determination is made as to whether the first plane mathematical relation is parallel to a second plane mathematical relation of the wafer loading plane; if yes, go to step 35, that is, the reference plane is determined to be parallel to the wafer loading plane, otherwise, go to step 36, that is, the levelness of the circuit board or the wafer loading plane should be adjusted when the reference plane is determined to be not parallel to the wafer loading plane. It is noted that the method of the disclosure is not limited to any conventional tools or instruments capable of detecting the first alignment marks, obtaining the location coordinates of the first alignment marks and computing (calculating) the first plane mathematical relation of the reference plane.

Figure 4:
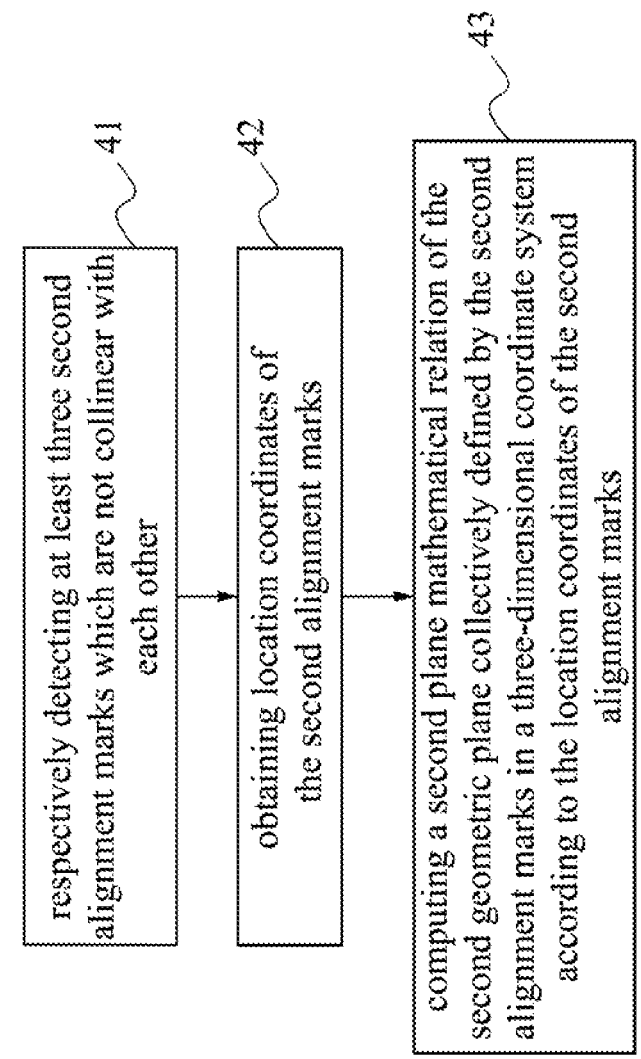
FIG. 4 is a sub-flow chart of step 34 of FIG. 3 according to one detailed embodiment.

FIG. 4 is a sub-flow chart of step 34 of FIG. 3 according to one detailed embodiment. In the embodiment, refer to FIG. 4, step 34 of FIG. 3 further includes step 41 to step 43 as follows. In step 41, at least three second alignment marks (as identification references) which are located on the wafer-loading plane and are not collinear with each other are detected respectively, and the second alignment marks collectively define a second geometric plane which is the same plane as the wafer-loading plane. In step 42, location coordinates of the second alignment marks are respectively obtained according to the detected second alignment marks. In step 43, a second plane mathematical relation of the second geometric plane in a three-dimensional coordinate system (e.g., Cartesian coordinate system) is computed (calculated) according to the location coordinates of the second alignment marks. The second plane mathematical relation also is the plane mathematical relation of the wafer-loading plane. It is noted, in other embodiment, the plane mathematical relation of the wafer-loading plane of the wafer stage also can be ready in advance rather than be computed (calculated) out with mathematic way. For example, the second plane mathematical relation can be a plane vector function or a plane equation, or any method capable of indicating the plane location of the wafer-loading plane.

Figure 5:
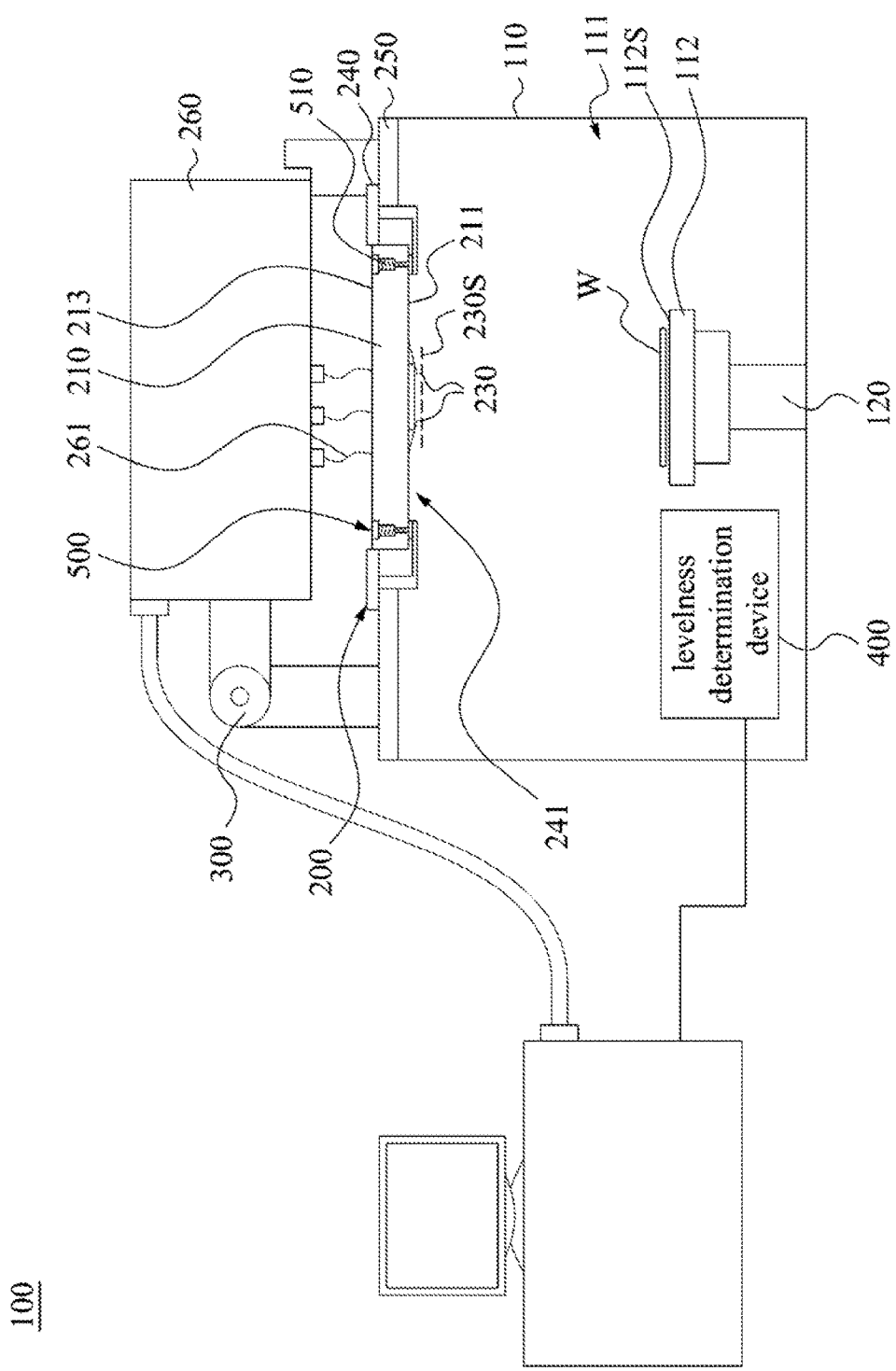
FIG. 5 is a schematic view of a system for utilizing a probe card according to one embodiment of the disclosure.
Figure 6A:
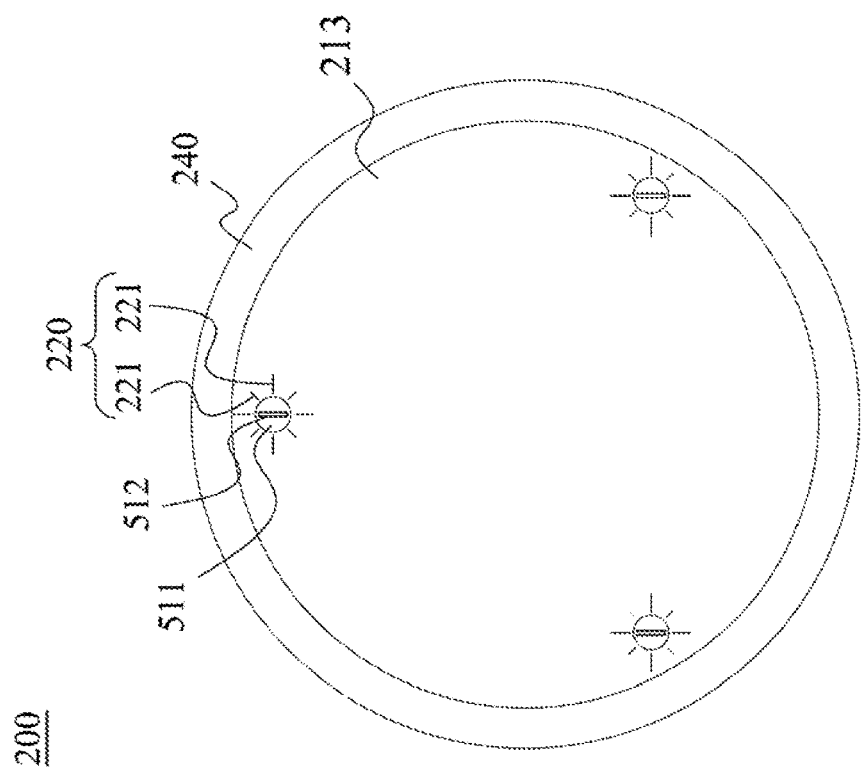
FIG. 6A is a bottom view of the probe card of FIG. 5.

Reference is now made to FIG. 5 and FIG. 6A in which FIG. 5 is a schematic view of a system 100 for utilizing the probe card 200 according to one embodiment of the disclosure. FIG. 6A is a bottom view of the probe card 200 of FIG. 5. As shown in FIG. 5 and FIG. 6A, the system 100 includes a wafer stage 112, a probe card 200, a movable carrier 300, a levelness determination device 400 and a levelness adjustment device 500. The wafer stage 112 is provided with a wafer-loading plane 112S, and the wafer-loading plane 112S is used for loading a wafer W thereon. The probe card 200 includes a circuit board 210, a plurality of probe pins 230 and at least three first alignment marks 211M which are not collinear with each other. The circuit board 210 is provided with a first main surface 211 and a second main surface 213 which are opposite to each other. The first alignment marks 211M and the probe pins 230 are respectively arranged on the first main surface 211 of the circuit board 210, and the first alignment marks 211M are coplanar to the first main surface 211 of the circuit board 210. A virtual plane 230S is collectively defined by pinpoints of the probe pins 230. The movable carrier 300 is used for moving the probe card 200 so that the circuit board 210 can be oriented to the wafer-loading plane 112S with the first main surface 211 of the circuit board 210. The levelness determination device 400 is used for determining whether a first geometric plane 212 collectively defined by the first alignment marks 211M is parallel to the wafer-loading plane 112S. The levelness adjustment device 500 is used for adjusting the levelness of the circuit board 210.

Thus, when the levelness determination device 400 determines that the first geometric plane 212 is parallel to the wafer-loading plane 112S, it indicates that the first main surface 211 of the circuit board 210 is parallel to both of the virtual plane 230S and the wafer-loading plane 112S. Therefore, a follow-up testing process for the wafer may go on. On the other hand, when the levelness determination device 400 determines that the first geometric plane 212 is not parallel to the wafer-loading plane 112S, a user can manually control the levelness adjustment device 500 to adjust the levelness of the circuit board 210, and then to determine the levelness of the circuit board 210 with the levelness determination device 400 until the first main surface 211 of the circuit board 210 is parallel to the wafer-loading plane 112S.

Because the virtual plane defined by pinpoints of the probe pins may be vague or distorted when the probe pins are deformed or configured error, thus, since the first alignment marks 211M is easier to be made on a reference plane of the circuit board 210, and is hard to deviate from the original location, other than the conventional art, the levelness of the probe card 200 is measured with the first alignment marks 211M located on the reference plane of the circuit board is easier to stably control the probe card 200 to be parallel to the wafer-loading plane 112S of the wafer stage 112, so that all of the probe pins 230 may completely and properly contact with all of the conductive leads of the DUT, thereby causing accurateness of testing results through the probe card.

Specifically, the system 100 for example includes a test head 260, a prober base 110 and an elevating device 120. The prober base 110 has a chamber 111 therein. The elevating device 120 is installed in the chamber 111, and connected to one end of the wafer stage 112 being opposite to the wafer-loading plane 112S, for moving the wafer W vertically. The test head 260 and the prober base 110 are pivotally connected together with the movable carder 300, and the movable carrier 300 can rotate the probe card 200 so that the first main surface 211 of the circuit board 210 is moved to face the wafer-loading plane 112S. The test head 260 is electrically connected to the circuit board 210 through electrical connectors 261.

Thus, when the levelness determination device 400 determines that the first geometric plane 212 is parallel to the wafer-loading plane 112S, it indicates that the first main surface 211 of the circuit board 210 is parallel to both of the virtual plane 230S and the wafer-loading plane 112S. Therefore, a follow-up testing process for the wafer may go on. On the other hand, when the levelness determination device 400 determines that the first geometric plane 212 is not parallel to the wafer-loading plane 112S, a user can manually control the levelness adjustment device 500 to adjust the levelness of the circuit board 210, and then to determine the levelness of the circuit board 210 with the levelness determination device 400 until the first main surface 211 of the circuit board 210 is parallel to the wafer-loading plane 112S.

Because the virtual plane defined by pinpoints of the probe pins may be vague or distorted when the probe pins are deformed or configured error, thus, since the first alignment marks 211M is easier to be made on a reference plane of the circuit board 210, and is hard to deviate from the original location, other than the conventional art, the levelness of the probe card 200 is measured with the first alignment marks 211M located on the reference plane of the circuit board is easier to stably control the probe card 200 to be parallel to the wafer-loading plane 112S of the wafer stage 112, so that all of the probe pins 230 may completely and properly contact with all of the conductive leads of the DUT, thereby causing accurateness of testing results through the probe card.

Specifically, the system 100 for example includes a test head 260, a prober base 110 and an elevating device 120. The prober base 110 has a chamber 111 therein. The elevating device 120 is installed in the chamber 111, and connected to one end of the wafer stage 112 being opposite to the wafer-loading plane 112S, for moving the wafer W vertically. The test head 260 and the prober base 110 are pivotally connected together with the movable carrier 300, and the movable carrier 300 can rotate the probe card 200 so that the first main surface 211 of the circuit board 210 is moved to face the wafer-loading plane 112S. The test head 260 is electrically connected to the circuit board 210 through electrical connectors 261.

However, the disclosure is not limited thereto, in other embodiments, the system also can operate automatically in which the levelness determination device and the levelness adjustment device are electrically controlled by a control processing unit (CPU) to instantly perform the determination tasks and the levelness adjustment tasks.

Refer to FIG. 5, in the embodiment, one end of each of the probe pins 230 is connected to the first main surface 211 of the circuit board 210, and pinpoints of the other ends of the probe pins 230 are aligned coplanarly to be collectively defined the aforementioned virtual plane 230.

It is noted, when the first main surface 211 or the first geometric plane 212 is parallel to the virtual plane 230S and the wafer-loading plane 112S, the virtual plane 230S is parallel to the wafer-loading plane 112S, thus, the first main surface 211 in the embodiment is as a reference plane for reflecting that the virtual plane 230S is parallel to the wafer-loading plane 112S. However, the system 100 of the disclosure is not limited thereto, as long as the so-called reference plane is oriented to one surface of the wafer stage, in other embodiments, the so-called reference plane also may be one surface of any sub element (e.g., frame body) of the probe card facing the wafer stage.

Refer to FIG. 5, the probe card 200 includes a support frame 240 and an outer plate 250. The support frame 240 is disposed on the outer plate 250. The outer plate 250 is disposed on the prober base 110. The support frame 240 is formed with a frame opening 241 thereon. The circuit board 210 is installed on the support frame 240, and the first main surface 211 (i.e., the reference plane) of the circuit board 210 exposes outwards from the frame opening 241. However, the circuit board 210 is not limited to be held on the support frame 240 by screws, clips or other similar methods.

Figure 6B:
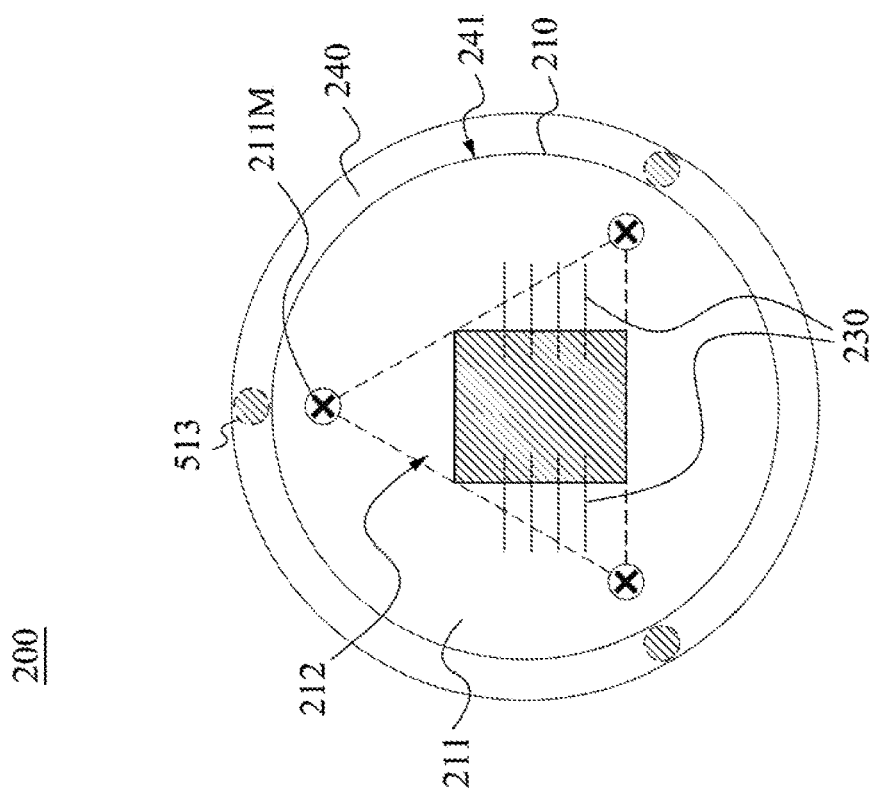
FIG. 6B is a top view of the probe card of FIG. 5.

FIG. 6B is a top view of the probe card 200 of FIG. 5. As shown in FIG. 5 and FIG. 6B, the levelness adjustment device includes at least three levelness adjustment screws 510. The levelness adjustment screws 510 are screwed on the circuit board 210, respectively. Each of the levelness adjustment screws 510 is penetrated through the first main surface 211 and the second main surface 213, and a screw head 511 (e.g., slotted screw head) of each of the levelness adjustment screws 510 exposes outwards from the second main surface 213, and a screw body 513 of each of the levelness adjustment screws 510 exposes outwards from the first main surface 211. When a user screws one of the levelness adjustment screws 510 to extend one end of the screw body 513 outwards from the first main surface 211 to push against the support frame 240, accordingly, the circuit board 210 is tilted for adjusting the levelness of the circuit board 210.

More particularly, an area of the second main surface 213 surrounding the screw head 511 is further provided with a calibration scale 220 having a plurality of scale values 221. The scale values 221 are correspondingly represented different lengths of the screw body 513 of the levelness adjustment screws 510 extending outwards from the first main surface 211, in other words, these different lengths thereof correspondingly cause different tilt conditions of the circuit board 210. For example, when a linear groove 512 of the screw head 511 aligns to one of the scale values 221 it indicates that the circuit board 210 is adjusted to as in the corresponding tilt condition.

In the embodiment, refer to FIG. 6A, these first alignment marks 211M are not collinear with each other on the first main surface 211, and the alignment marks 211M are identical, and each of the alignment marks 211M, for example, forms in an X shape. The first alignment marks 211M are not limited to any formations presented on the first main surface 211, for example, each of the alignment marks can be presented as a flat pattern layer (e.g., printed pattern layer, plating layer or coating layer) or a three-dimensional object (e.g., screws or stickers). However, the disclosure is not limited to the aforementioned example, as long as the first alignment marks are detectable or recognizable, appearances, sizes or formation types of the first alignment marks are not limited in the disclosure.

Furthermore, for example, refer to FIG. 6A, these first alignment marks 211M are arranged to outline an equilateral triangle on the first main surface 211. However, the disclosure is not limited to the aforementioned example, these first alignment marks 211M also may be arranged to outline a right-angled triangle, an isosceles triangle or one of other kinds of triangles.

Figure 7:
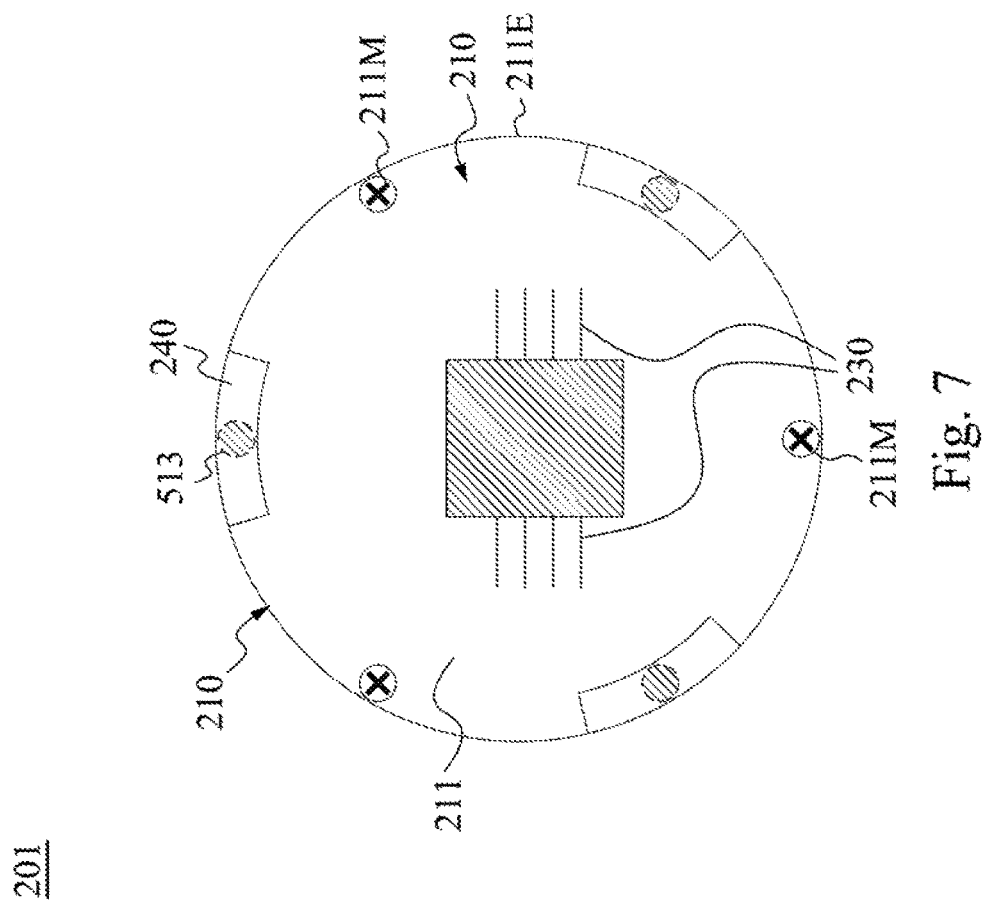
FIG. 7 is a bottom view of a probe card according to another embodiment of the disclosure.

FIG. 7 is a bottom view of a probe card 201 according to another embodiment of the disclosure. Refer to FIG. 7, the probe card 210 of FIG. 7 is substantially the same as the aforementioned probe card 200, except that the alignment marks 211M are respectively located at a periphery area 211E of the first main surface 211 (i.e., reference plane) of the circuit board 210. For example, when the circuit board 210 is formed as a circular disk, the alignment marks 211M are respectively located on the first main surface 211 (i.e., reference plane) and connected to a circumferential surface (periphery area 211E) of the circuit board 210.

Figure 8:
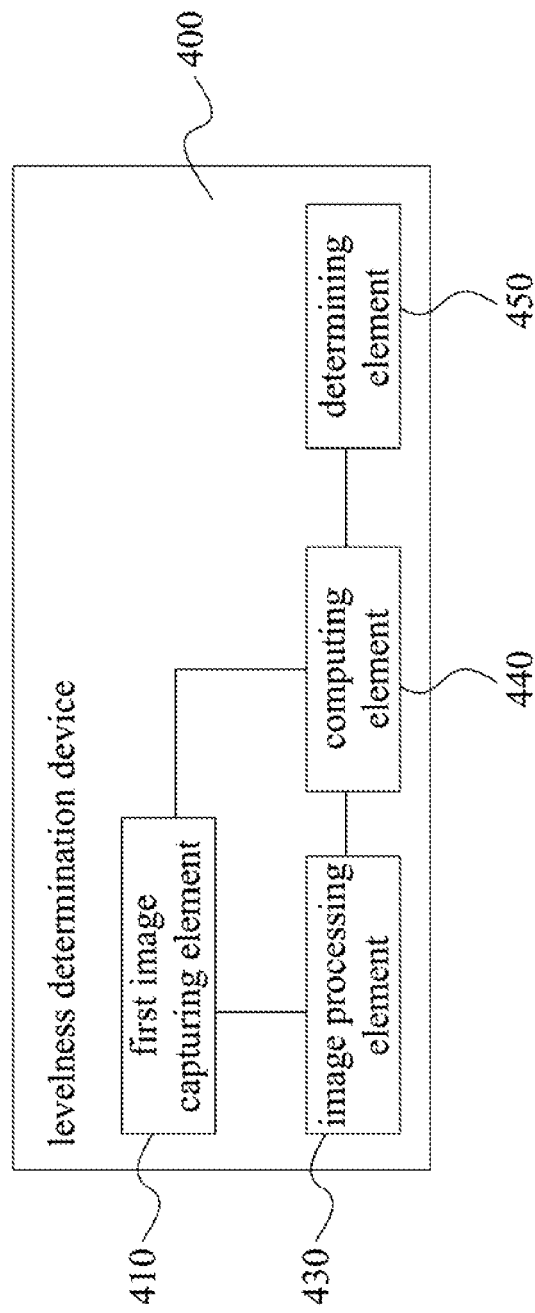
FIG. 8 is a function block diagram of a levelness adjustment device according to another embodiment of the disclosure.

FIG. 8 is a function block diagram of a levelness adjustment device 400 according to another embodiment of the disclosure. Refer to FIG. 5 and FIG. 8, the levelness determination device 400 in great details includes a first image capturing element 410, an image processing element 430, a computing element 440 and a determining element 450. The first image capturing element 410 for example can be a camera device, and the first image capturing element 410 is used for capturing a first image of the first main surface 211 (i.e., reference plane) including the first alignment marks thereon. For example, the first image capturing element 410 is disposed in the prober base 110, and is able to face towards the first alignment marks 211M of the circuit board 210. The image processing element 430 is electrically connected to the first image capturing element 410, and is used for analyzing the first image and detecting the first alignment marks 211M of the first image to obtain location coordinates of the first alignment marks 211M. For example, the image processing element 430 can be a graphic processing (GPU)

circuit which is able to identify the first alignment marks 211M from the first image, and compute (calculate) the location coordinates of the first alignment marks 211M in a three-dimensional coordinate system according to the relative positions of the first alignment marks 211M. The computing element 440 is electrically connected to the first image capturing element 410 and the image processing element 430, and the computing element 440 is used for computing (calculating) a first plane mathematical relation of the first geometric plane in the three-dimensional coordinate system according to the location coordinates of the first alignment marks 211M. For example, the computing element 440 may be a central processing, unit (CPU) circuit, a part of the central processing unit (CPU) circuit, or a calculation chip which is able to compute (calculate) the three-location coordinates of the first alignment marks 211M to a first plane mathematical relation of the first geometric plane 212 defined by the first alignment marks 211M in the three-dimensional coordinate system. For example, the first plane mathematical relation can be a plane vector function or a plane equation of the first main surface 211 (i.e., reference plane), or any method capable of indicating the plane location of the first main surface 211 (i.e., reference plane). The determining element 450 is electrically connected to the computing element 440, and is used for determining whether the first plane mathematical relation of the first main surface 211 (i.e., reference plane) is parallel to a second plane mathematical relation of the wafer-loading plane 112S. For example, the determining element 450 can be a control processing unit (CPU) circuit or a part of the control processing unit (CPU) circuit. A determination is made as to whether the first plane mathematical relation is parallel to the second plane mathematical relation by conventional mathematical techniques. For example, a determination is made as to whether a slope of the first plane mathematical relation is equal to a slope of the second plane mathematical relation.

In addition, the aforementioned image capturing element and image processing element also can be utilized to detect the aforementioned virtual plane collectively defined by the pinpoints of the probe pins, or determine whether a single virtual plane can be collectively defined by the pinpoints of the probe pins. Similarly, the aforementioned computing element also can be utilized to compute (calculate) the third plane mathematical relation of the virtual plane. The aforementioned image processing element also can be utilized to determine whether the first plane mathematical relation is parallel to third plane mathematical relation as described above, the present embodiment not be repeated here.

Figure 9:
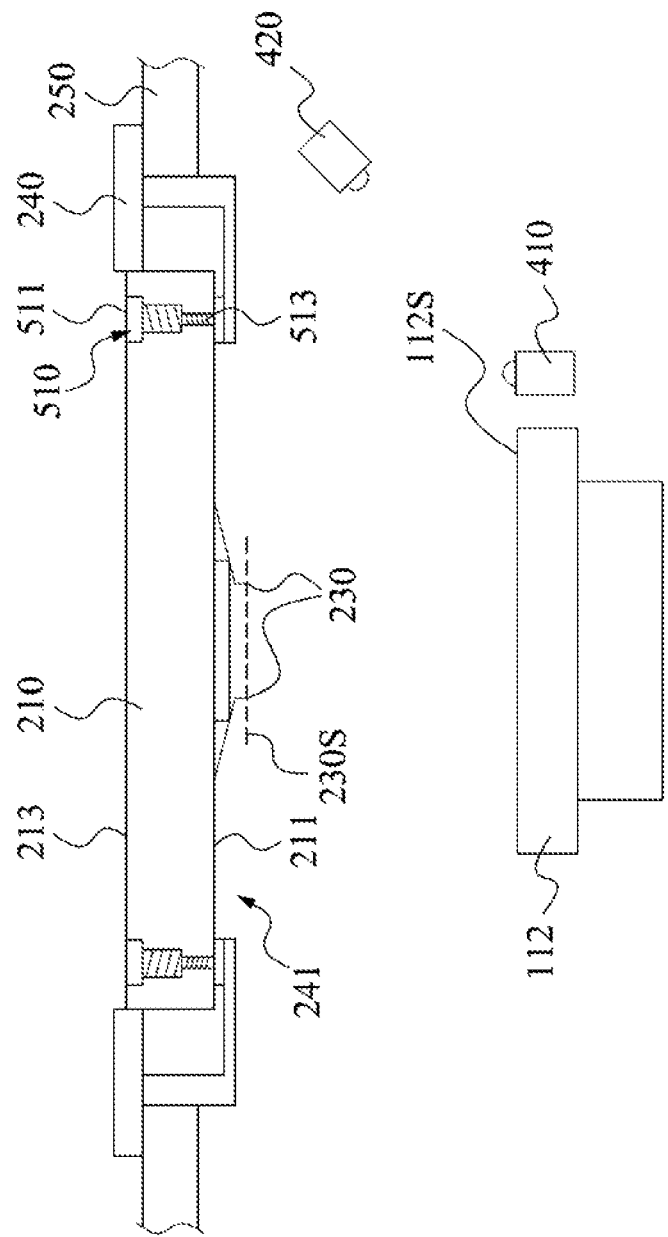
FIG. 9 is a schematic view of a probe card and a wafer stage according to another embodiment of the disclosure.
Figure 10:
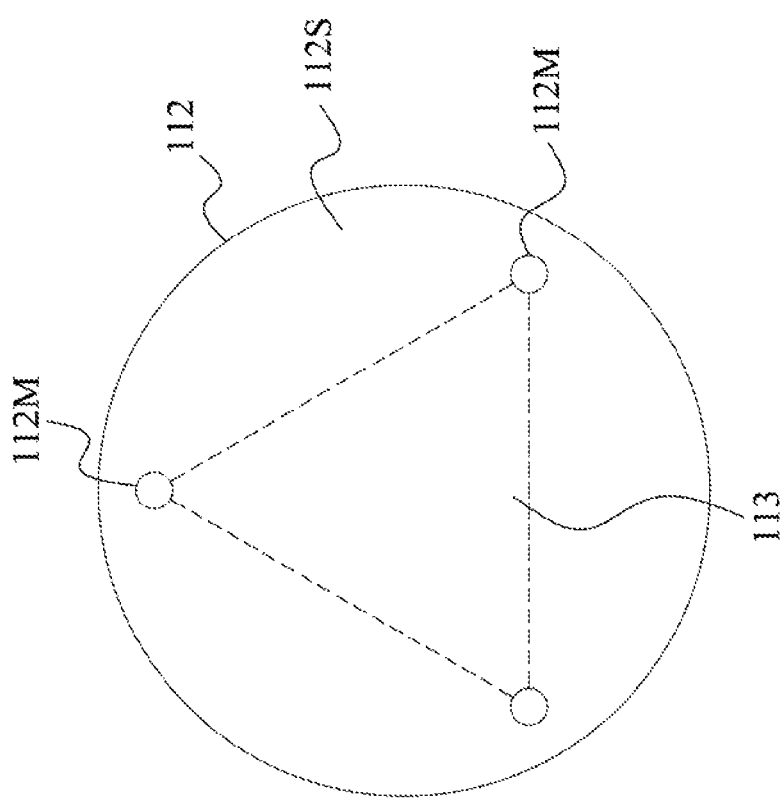
FIG. 10 is a top view of the wafer-loading plane of FIG. 9.

Reference is now made to FIG. 9 and FIG. 10 in which FIG. 9 is a schematic view of a probe card 200 and a wafer stage 112 according to another embodiment of the disclosure; and FIG. 10 is a top view of the wafer-loading plane 112S of FIG. 9. As shown in FIG. 9 and FIG. 10, since the wafer stage 112 is elevatable, thus, the wafer-loading plane 112S of the wafer stage 112 is changeable in height. Thus, preferably, if the wafer stage 112 is not needed to be moved to a specific position, a determination in the embodiment can be made as to whether the first main surface 211 (i.e., reference plane) of the probe card 200 is parallel to the wafer-loading plane 112S of the wafer stage 112.

As shown in FIG. 9 and FIG. 10, the wafer-loading plane 112S is provided with at least three second alignment marks 112M which are located on the wafer-loading plane 112S and are not collinear with each other. The second alignment marks 112M are coplanar with the wafer-loading plane 112S. The levelness determination device 400 further includes a second image capturing element 420. The second image capturing element 420 may be a camera device, and the second image capturing element 420 is used for capturing a second image of the wafer-loading plane 112S including the second alignment marks 112M. For example, the second image capturing element 420 is arranged above the wafer stage 112 and the second image capturing element 420 able to face towards the wafer-loading plane 112S. The aforementioned image processing element 430 analyzes the second image and detects the second alignment marks 112M of the second image to obtain location coordinates of the second alignment marks.

For example, the image processing element 430 identifies the second alignment marks 112M from the second image, and compute (calculate) the location coordinates of the second alignment marks 112M in the three-dimensional coordinate system according to the relative positions of the second alignment marks 211M. The computing element 440 computes (calculates) a second plane mathematical relation of the second geometric plane 113 in the three-dimensional coordinate system according to the location coordinates of the second alignment marks 112M. For example, the computing element 440 computes (calculates) the three-location coordinates of the second alignment marks 112M to a second plane mathematical relation of the second geometric plane 113 defined by the second alignment marks 112M in the three-dimensional coordinate system. For example, the second plane mathematical relation can be a plane vector function or a plane equation of the wafer-loading plane 112S, or any method capable of indicating the plane location of the wafer-loading plane 112S.

Although the appearance of the second alignment marks 112M and the appearance of the first alignment marks 211M (FIG. 6A and FIG. 7) are different, however, the appearance of the second alignment marks still can alternatively be changed to the appearance of the first alignment marks, the present embodiment not be repeated here.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A method for utilizing a probe card, comprising:
  (a) providing a probe card comprising a plurality of probe pins and a circuit board having a reference plane and at least three first alignment marks which are formed on the reference plane and not collinear with each other, wherein the first alignment marks collectively define a first geometric plane which is the same plane as the reference plane;
  (b) moving the probe card to be oriented to a wafer-loading plane of a wafer stage with the reference plane of the circuit board;
  (c) determining whether the first geometric plane is parallel to the wafer-loading plane, the step (c) further comprising:

respectively detecting the first alignment marks;
respectively obtaining location coordinates of the first alignment marks according to the first alignment marks being detected;
computing a first plane mathematical relation of the first geometric plane in a three-dimensional coordinate system according to the location coordinates of the first alignment marks;
determining whether the first plane mathematical relation is parallel to a second plane mathematical relation of the wafer-loading plane; and
deciding the reference plane not to be parallel to the wafer-loading plane when a determination of the first plane mathematical relation being not parallel to the second plane mathematical relation is made;
(d) adjusting a levelness of the circuit board to arrange the first geometric plane to be parallel to the wafer-loading plane when a determination of the first geometric plane being not parallel to the wafer-loading plane is made; and
(e) contacting a wafer which is located on the wafer-loading plane with the probe pins, and testing the wafer when the first geometric plane is parallel to the wafer-loading plane.

2. The method for utilizing the probe card of claim 1, wherein, before determining whether the first plane mathematical relation is parallel to the second plane mathematical relation of the wafer-loading plane in step(c), the method further comprises:
respectively detecting at least three second alignment marks which are located on the wafer-loading plane and are not collinear with each other, wherein the second alignment marks collectively define a second geometric plane which is the same plane as the wafer-loading plane;
respectively obtaining location coordinates of the second alignment marks according to the detected second alignment marks; and
computing a second plane mathematical relation of the second geometric plane in the three-dimensional coordinate system according to the location coordinates of the second alignment marks.

3. The method for utilizing the probe card of claim 1, wherein the step (d) further comprises:
rotating at least one of levelness adjustment screws screwed on the circuit board for adjusting the planarity of the reference plane of the circuit board.

4. The method for utilizing the probe card of claim 1, wherein the step (a) further comprises:
enabling the reference plane of the circuit board to be parallel to a virtual plane collectively defined by pinpoints of the probe pins.

5. The method for utilizing the probe card of claim 4, wherein enabling the reference plane to be parallel to the virtual plane, further comprises:
respectively detecting the first alignment marks to obtain location coordinates of the first alignment marks;
computing a first plane mathematical relation of the first geometric plane in a three-dimensional coordinate system according to the location coordinates of the first alignment marks;
detecting the pinpoints of the probe pins for defining the virtual plane, and computing a third plane mathematical relation in the three-dimensional coordinate system according to the virtual plane;
determining whether the first plane mathematical relation is parallel to the third plane mathematical relation;
adjusting the alignments of the pinpoints of the probe pins when a determination of the first plane mathematical relation being not parallel to the third plane mathematical relation is made; and
repeating the step of detecting the pinpoints of the probe pins and computing another third plane mathematical relation in the three-dimensional coordinate system based on the virtual plane, the step of determining whether the first plane mathematical relation is parallel to the third plane mathematical relation, and the step of adjusting the alignment of the pinpoints of the probe pins, until a determination of the first plane mathematical relation being parallel to the third plane mathematical relation is made.

6. The method for utilizing the probe card of claim 4, wherein enabling the reference plane to be parallel to the virtual plane further comprises:
determining whether the pinpoints of the probe pins are coplanarly aligned with each other for collectively defining the virtual plane;
adjusting the alignment of the pinpoints of the probe pins when the pinpoints of the probe pins are not coplanarly aligned with each other for collectively defining the virtual plane; and
repeating the step of determining whether the pinpoints of the probe pins are coplanarly aligned with each other for collectively defining the virtual plane, and the step of adjusting the alignment of the pinpoints of the probe pins, until the pinpoints of the probe pins are coplanarly aligned with each other to collectively define the virtual plane.

7. A system for utilizing a probe card, comprising:
a wafer stage having a wafer-loading plane for loading a wafer thereon;
a probe card comprising a plurality of probe pins and a circuit board having a reference plane and at least three first alignment marks which are located on the reference plane and not collinear with each other, wherein the first alignment marks are coplanar with the reference plane, and a virtual plane collectively defined by pinpoints of the probe pins is parallel to the reference plane;
a movable carrier for moving the probe card to be oriented to the wafer-loading plane with the reference plane of the circuit board;
a levelness determination device for determining whether a first geometric plane collectively defined by the first alignment marks is parallel to the wafer-loading plane, the levelness determination device comprising a first image capturing element for capturing a first image of the reference plane including the first alignment marks; an image processing element electrically connected to the first image capturing element, for detecting the first alignment marks to obtain location coordinates of the first alignment marks a computing element electrically connected to the first image capturing element and the image processing element for computing a first plane mathematical relation of the first geometric plane in a three-dimensional coordinate system according to the location coordinates of the first alignment marks; and a determining element electrically connected to the computing element, for determining whether the first plane mathematical relation is parallel to a second plane mathematical relation of the wafer-loading plane; and
a levelness adjustment device for adjusting a levelness of the circuit board.

8. The system for utilizing the probe card of claim 7, wherein the levelness adjustment device comprises at least three levelness adjustment screws which are screwed on the circuit board, respectively.

9. The system for utilizing the probe card of claim 7, wherein the wafer-loading plane is provided with at least three second alignment marks which are not collinear with each other, and the second alignment marks are coplanar with the wafer-loading plane.

10. The system for utilizing the probe card of claim 9, wherein the levelness determination device further comprises:
   a second image capturing element for capturing a second image of the wafer-loading plane including the second alignment marks,
   wherein the image processing element detects the second alignment marks to obtain location coordinates of the second alignment marks, and the computing element computes the second plane mathematical relation of the wafer-loading plane according to the location coordinates of the second alignment marks.

11. The system for utilizing the probe card of claim 7, wherein the first alignment marks are arranged to outline a triangle shape.

12. The system for utilizing the probe card of claim 7, wherein the probe pins are connected to the reference plane.

13. The system for utilizing the probe card of claim 7, wherein the first alignment marks are located at the periphery of the reference plane.

* * * * *